United States Patent
Hong et al.

(10) Patent No.: US 9,799,411 B2
(45) Date of Patent: Oct. 24, 2017

(54) MEMORY MODULE SET HAVING OFFSET MEMORY MODULE UNITS FACILITATING PIN CONNECTIONS TO MAIN IC, AND SEMICONDUCTOR MEMORY DEVICE AND SYSTEM INCLUDING THE SAME

(71) Applicant: SAMSUNG ELECTRONICS CO., LTD., Suwon-si, Gyeonggi-do (KR)

(72) Inventors: Ji-Cheol Hong, Hwaseong-si (KR); Young-Jin Cho, Seoul (KR); Dong-Gi Lee, Yongin-si (KR); Hee-Chang Cho, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 188 days.

(21) Appl. No.: 14/705,745

(22) Filed: May 6, 2015

(65) Prior Publication Data
US 2016/0004633 A1    Jan. 7, 2016

(30) Foreign Application Priority Data
Jul. 7, 2014    (KR) ........................ 10-2014-0084617

(51) Int. Cl.
| | | |
|---|---|---|
| *G11C 17/00* | (2006.01) | |
| *G11C 29/52* | (2006.01) | |
| *G06F 13/16* | (2006.01) | |
| *G11C 5/04* | (2006.01) | |

(52) U.S. Cl.
CPC .......... *G11C 29/52* (2013.01); *G06F 13/1684* (2013.01); *G11C 5/04* (2013.01)

(58) Field of Classification Search
None
See application file for complete search history.

(56) References Cited

U.S. PATENT DOCUMENTS

| | | |
|---|---|---|
| 6,202,110 B1 | 3/2001 | Coteus et al. |
| 6,414,904 B2 | 7/2002 | So et al. |
| 6,833,618 B2 | 12/2004 | Ono et al. |
| 7,386,649 B2 | 6/2008 | Jeddeloh |
| 7,539,035 B2 | 5/2009 | Lee et al. |
| 7,800,918 B2 | 9/2010 | Saeki |

(Continued)

FOREIGN PATENT DOCUMENTS

| | | |
|---|---|---|
| JP | 11330394 | 11/1999 |
| JP | 2002298939 | 10/2002 |

(Continued)

*Primary Examiner* — Son Dinh
*Assistant Examiner* — Sultana Begum
(74) *Attorney, Agent, or Firm* — Volentine & Whitt, PLLC

(57) ABSTRACT

A memory module set includes a main integrated circuit (IC) for transmitting and receiving an electrical signal, a first group of memory modules including at least one memory module having a first pin unit connected to the main IC, and a second group of memory modules including at least one memory module having a second pin unit connected to the main IC. The groups of memory modules and the main IC are arrayed in a first direction on a substrate, and the second group of memory modules is offset with respect to the first group of memory modules in a second direction that is perpendicular to the first direction so as to have a position relative to the main IC in the second direction that is different from that of the first group of memory modules.

20 Claims, 15 Drawing Sheets

(56) References Cited

U.S. PATENT DOCUMENTS

| | | |
|---|---|---|
| 8,140,936 B2 | 3/2012 | Gower et al. |
| 8,199,515 B2 | 6/2012 | Bandholz et al. |
| 8,503,211 B2 | 8/2013 | Gillingham et al. |
| 2008/0002336 A1* | 1/2008 | Zimmerman ........... H01L 25/50 361/600 |
| 2012/0069621 A1* | 3/2012 | Norman .............. G06F 13/1694 365/100 |
| 2012/0191921 A1* | 7/2012 | Shaeffer ............. G06F 13/1678 711/149 |
| 2015/0034076 A1* | 2/2015 | Dyche ................. A61M 11/005 128/200.16 |

FOREIGN PATENT DOCUMENTS

| | | |
|---|---|---|
| JP | 2004355063 | 12/2004 |
| JP | 2008205402 | 9/2008 |
| JP | 2012256326 | 12/2012 |

\* cited by examiner

FIG. 1
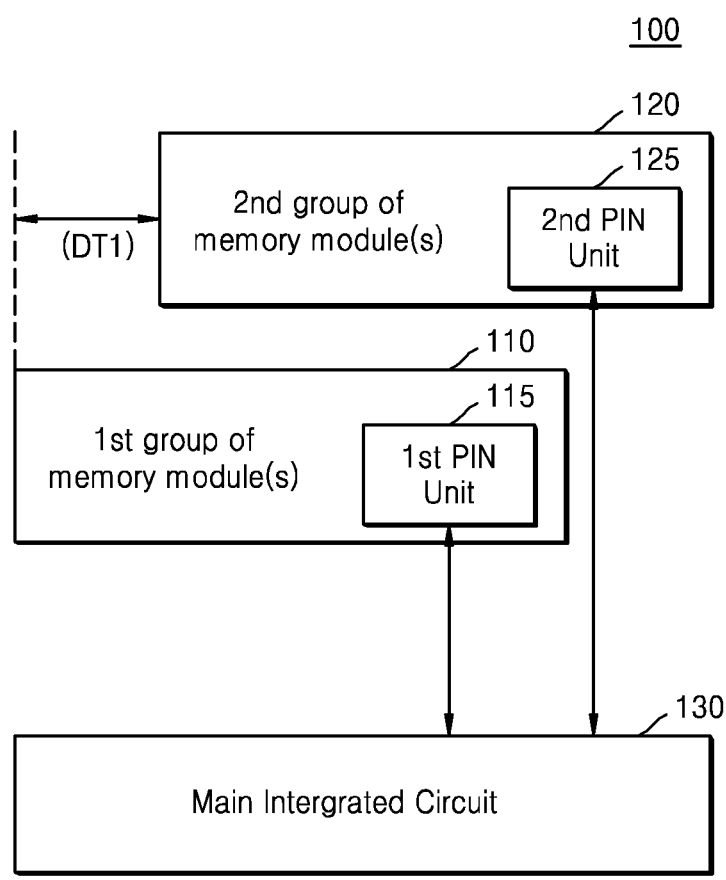
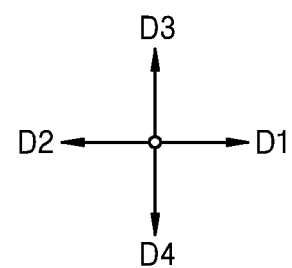

FIG. 3
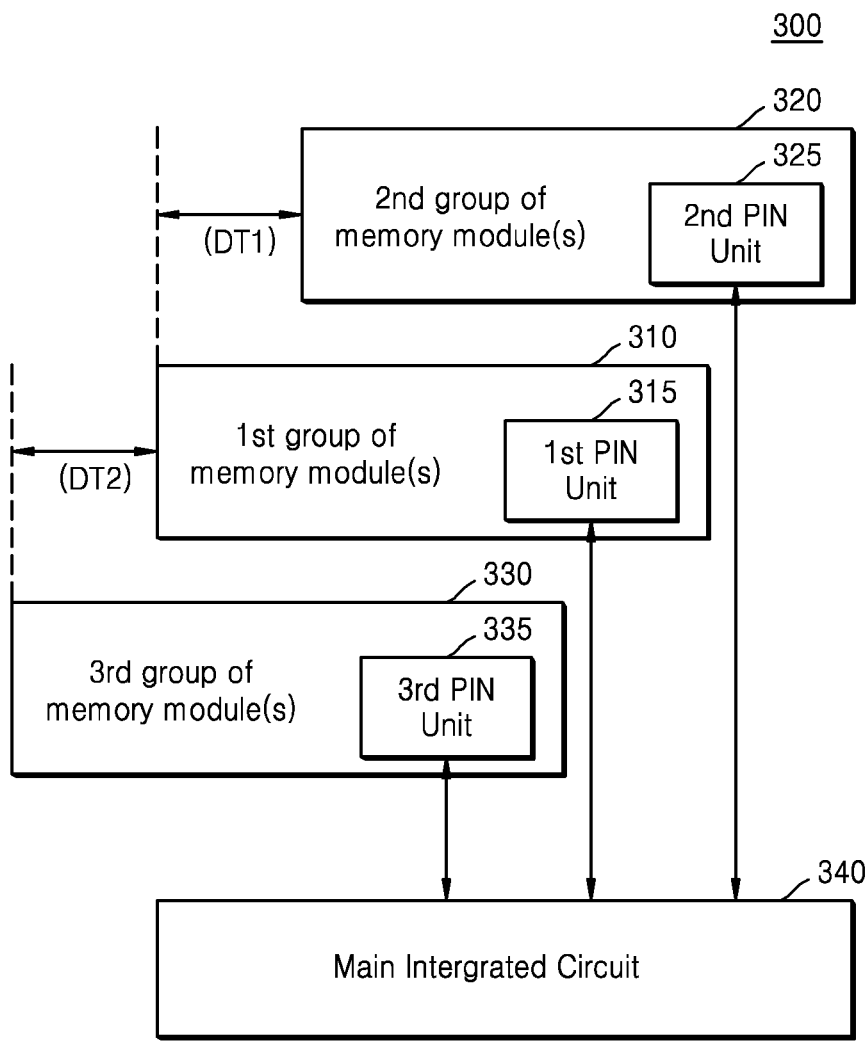
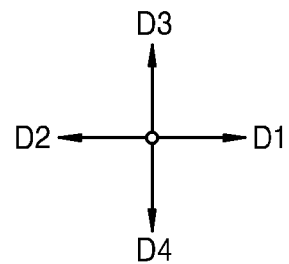

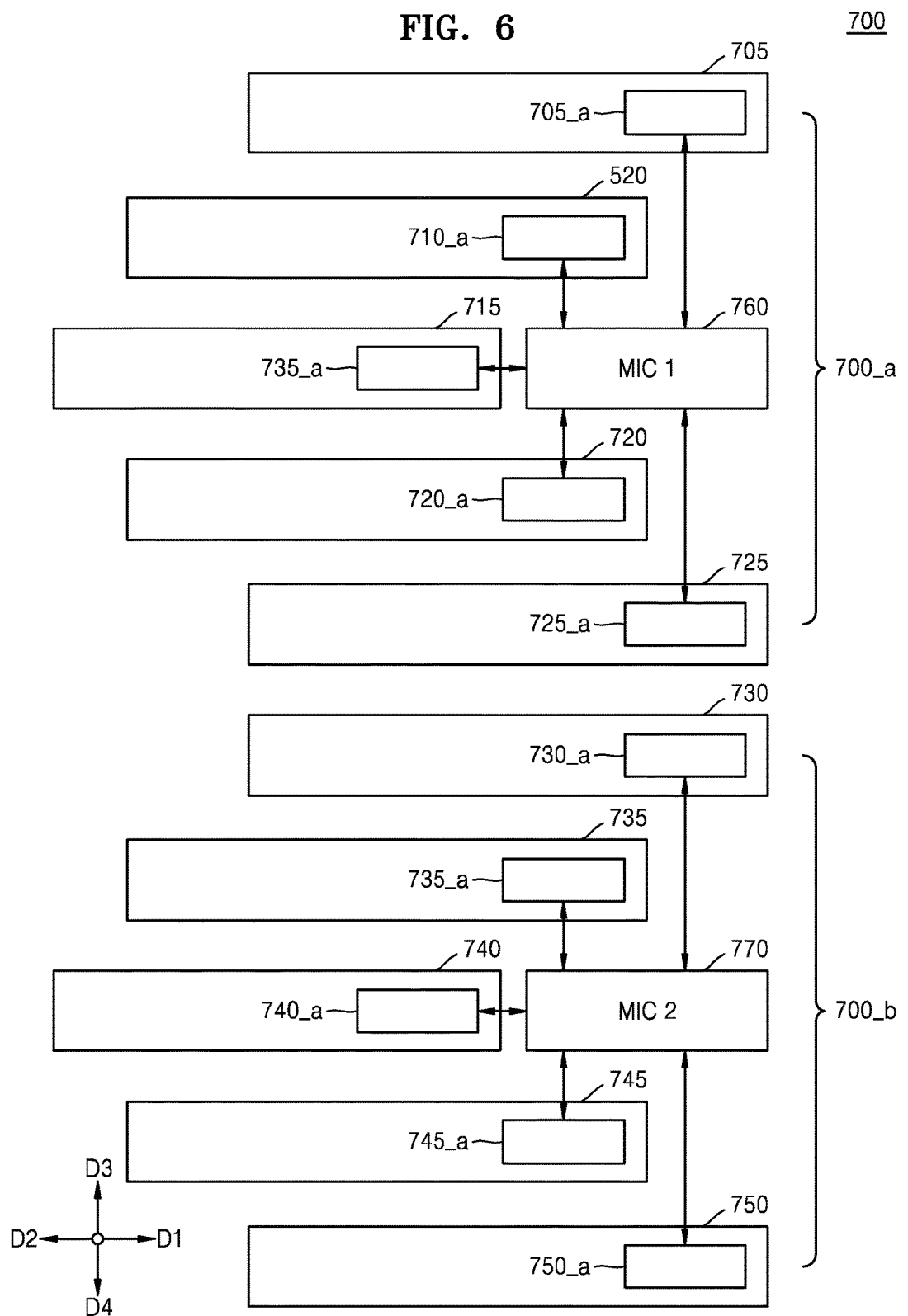

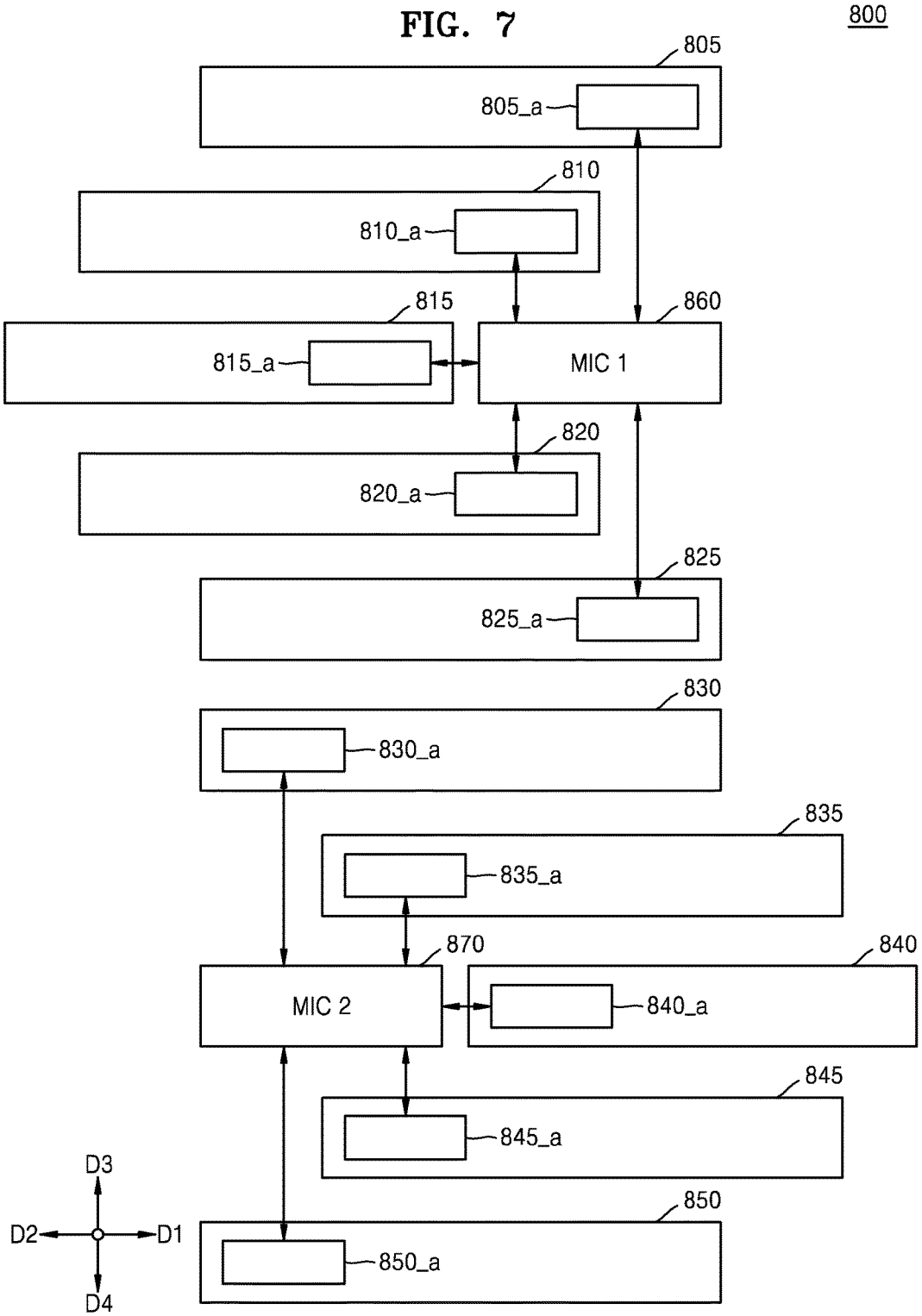

US 9,799,411 B2

MEMORY MODULE SET HAVING OFFSET MEMORY MODULE UNITS FACILITATING PIN CONNECTIONS TO MAIN IC, AND SEMICONDUCTOR MEMORY DEVICE AND SYSTEM INCLUDING THE SAME

PRIORITY STATEMENT

This application claims the benefit of Korean Patent Application No. 10-2014-0084617, filed on Jul. 7, 2014, in the Korean Intellectual Property Office, the disclosure of which is hereby incorporated by reference in its entirety.

BACKGROUND

The inventive concept relates to a memory module set, a semiconductor memory device including the same, and a semiconductor memory system including the memory module set.

In general, an electronic memory, such as a dynamic random access memory (DRAM), is typically provided in a computer in the form of a memory module in which several memory chips are mounted on a printed circuit board (PCB). The memory module may be a single in-line memory module (SIMM) in which a plurality of memory chips are mounted on one surface of the PCB, or a dual in-line memory module (DIMM) in which a plurality of memory chips are mounted on each of both surfaces of the PCB. The memory module is provided to increase the memory capacity of the computer so that the computer may exhibit a high performance and allow for mass-storage of data and other information. The greater the memory capacity of a memory module becomes, the greater and more complex the wirings on the PCB must be. Thus, increasing the memory capacity of a memory module may compromise, i.e., lead to a decrease in, the operating speed of the memory.

SUMMARY

According to an aspect of the inventive concept, there is provided a memory module set comprising a substrate, a main integrated circuit (IC) mounted to the substrate, a first memory module unit including at least one memory module mounted to the substrate, a second memory module unit including at least one memory module mounted to the substrate, and in which the at least one memory module comprises a first block of pins electrically connected to the main IC, the at least one memory module of the second memory unit comprising a second block of pins electrically connected to the main IC, the first memory module unit, the second memory module unit and the main integrated circuit IC are spaced relative to one another in one direction on the substrate, and the at least one memory module of second memory module unit is offset with respect to the at least one memory module of the first memory module unit by a first distance in a direction perpendicular to said one direction.

According to another aspect of the inventive concept, there is provided a semiconductor memory system, comprising a substrate including electrical wiring, at least one group of memory module units mounted to the substrate, and at least one main integrated circuit (IC) mounted to the substrate, and in which the memory module units of each said group are disposed on the substrate in a radial array about a respective said main IC, and each of the module units of the group comprises at least one memory module each having a plurality of memory pins connected to the respective main IC via the electrical wiring.

According to another aspect of the inventive concept, there is provided an electronic device comprising a substrate including electrical wiring, first and second memory module units, and a chip comprising a main integrated circuit (IC) mounted to the substrate, and in which each of the memory module units includes at least one memory module mounted to the substrate, each at least one memory module comprises a semiconductor memory device that stores data and plurality of memory pins electrically connected to the semiconductor memory device and electrically connected to the main IC via the electrical wiring, the size and shape of the footprints of the first and second memory module units are the same, the first memory module unit and the second memory module unit and the chip comprising the main IC are spaced relative to one another on the substrate along one direction, and the second memory module unit is offset with respect to the first memory module unit in a direction perpendicular to said one direction.

BRIEF DESCRIPTION OF THE DRAWINGS

Exemplary embodiments of the inventive concept will be more clearly understood from the following detailed description taken in conjunction with the accompanying drawings in which:

FIG. 1 is a diagram of a layout of an embodiment of a memory module set according to the inventive concept;

FIG. 3 is a diagram of a layout of another embodiment of a memory module set according to the inventive concept;

FIG. 6 is a diagram of a layout of an embodiment of a semiconductor memory system according to the inventive concept;

FIG. 7 is a diagram of a layout of another embodiment of a semiconductor memory system according to the inventive concept;

DETAILED DESCRIPTION OF THE EMBODIMENTS

Figure 2:
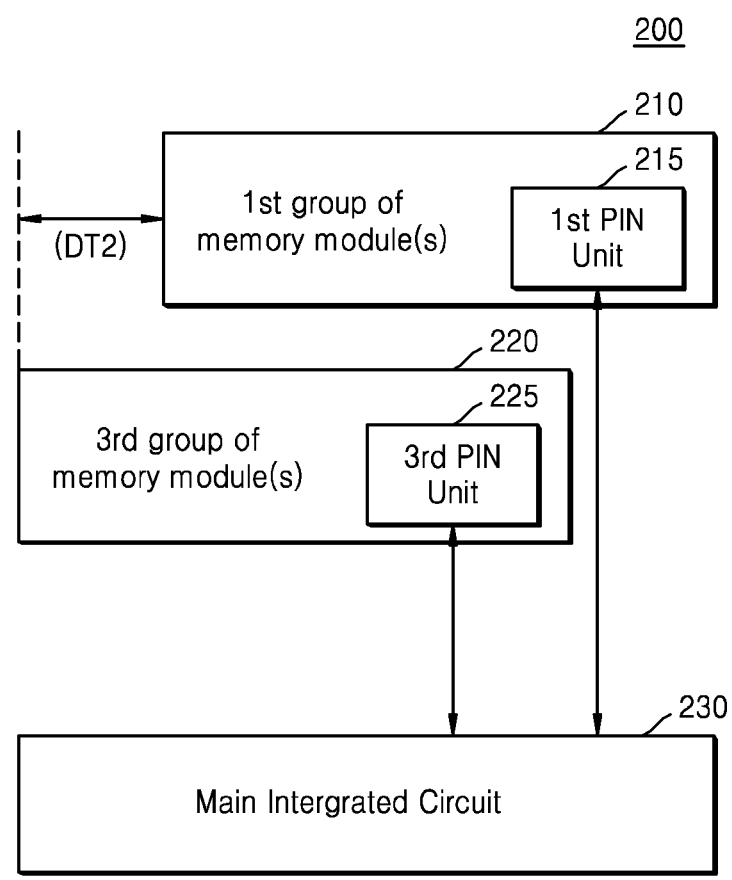
FIG. 2 is a diagram of a layout of another embodiment of a memory module set according to the inventive concept.

The inventive concept will now be described more fully with reference to the accompanying drawings, in which exemplary embodiments of the inventive concept are shown. The inventive concept may, however, be embodied in many different forms, and should not be construed as being limited to the embodiments set forth herein; rather, these embodiments are provided so that this disclosure will be thorough and complete, and will fully convey the concept of the inventive concept to those of ordinary skill in the art. Thus, the inventive concept may include all revisions, equivalents, or substitutions which are included in the concept and the technical scope related to the invention. Like reference numerals in the drawings denote like elements. In the drawings, the dimension of structures may be exaggerated for clarity.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof. Also, the term "substantially" is used in general to allow for manufacturing tolerances or differences which result from a manufacturing process although unintended.

While such terms as "first," "second," etc., may be used to describe various components, such components must not be limited to the above terms. The above terms are used only to distinguish one component from another. For example, a first component may be named as a second component, and similarly the second component may be named as the first component, without departing from the scope of the inventive concept.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal. For example, the term "radiate" may be used in its broadest sense to refer to a radial pattern similar to that of the numbers on a clock face relative to the center of the clock face. The term "offset" when used to describe a relationship between two components/features or the footprint thereof in a particular direction may refer to an offset between corresponding ends (or other corresponding points of reference) of the components/features or footprint as the drawings will make clear. The term "wire" is also used in its broadest sense and may refer to a conductive trace.

Expressions such as "at least one of," when preceding a list of elements, modify the entire list of elements and do not modify the individual elements of the list.

FIG. 1 illustrates the layout of an embodiment of a memory module set 100, i.e., an arrangement of components of the memory module on its substrate (e.g., a motherboard), according to the inventive concept.

Referring to FIG. 1, the memory module set 100 includes a first group of memory modules 110, a second group of memory modules 120, and a main integrated circuit (IC) 130. The first group of memory modules 110 includes at least one memory module having a first pin unit 115 comprising a block of memory pins associated with the memory module(s) of the first group. The second group of memory modules 120 includes at least one memory module having a second pin unit 125 comprising a block of memory pins associated with the memory module(s) of the second group. The memory modules of this memory module set may each be one of a single in-line memory module (SIMM) or a dual in-line memory module (DIMM), or a Rambus in-line memory module (RIMM). Thus, a so-called "group" of memory modules may be a memory module unit.

Each memory module (not shown) of the first and second groups of memory modules 110 and 120 of the present embodiment may include a printed circuit board (PCB) and at least one memory chip (e.g., a semiconductor memory device). The PCB is formed by coating a phenol or epoxy glass (or FR-4) resin substrate with a copper foil of a predetermined thickness. The copper foil is patterned to form circuit wiring, and the memory chip(s) is/are mounted on the substrate as connected to the wiring via conductive bumps of the part.

The PCB may be a single layer PCB in which wiring is formed on only one (major) surface of the substrate or a double layer PCB in which wirings are formed on both (major) surfaces of the substrate. Insulators, such as prepregs, may be used to form a PCB having three or more layers of copper wiring.

Each memory chip mounted on the PCB may be a DRAM, an SRAM, a flash memory, an EEPROM, a PRAM, an MRAM, or an RRAM. As mentioned above, only one or a plurality of memory chips may be mounted to the PCB. Thus, a memory chip may be mounted on only one surface of the PCB or memory chips may be mounted on both surfaces of the PCB, respectively. For convenience, a PCB to which a memory chip(s) is/are mounted may simply be referred to hereinafter as a substrate.

The main IC 130 may be one of a memory controller, a processor, and a buffer unit. When the main IC 130 constitutes a memory controller, the main IC 130 may communicate with a host through a host channel, transmit a command and an address, and transmit and receive data. The main IC 130 may control the first group of memory modules 110 and the second group of memory modules 120. When the main IC 130 constitutes a processor, the main IC 130 may execute a previously determined program (referred to as firmware) in response to the command received from the host on to control an operation of the first group of memory modules 110 and the second group of memory modules 120. When the main IC 130 constitutes a buffer unit, the main IC 130 may be disposed between the groups of memory modules 110, 120 and a memory controller to relay data transmitted therebetween. For example, the main IC 130 may be an advanced memory buffer (AMB) that is connected through all the memory chips of the first group of memory modules 110 and the second group of memory modules 120 and the first pin unit 115 and the second pin unit 125, stores data transmitted from a memory controller in the memory chips, reads requested data from the memory chips, transmits the read data to the memory controller, and transmits data and requests of the memory controller to an AMB of a third group of memory modules (not shown) installed in a next slot. The main IC 130 allows the module set to have a high transmission bandwidth and a high memory capacity.

With regard to the layout of the module set 100, as shown in FIG. 1, the footprints of the main IC 130, first group of memory modules 110 and second group of memory modules 120 are spaced from each other on the substrate in opposing directions (D3, D4 in the figure). Moreover, the size and shape of the footprints of the first group of memory modules 110 and second group of memory modules 120 may be the same in the case in which each group of memory modules has only one memory module or in the case in which each group of memory modules has more than one memory module. However, reference to the "footprints" of components or groups will be omitted in the following description for the sake of brevity as the descriptions may apply equally well to the components or groups of components themselves.

The main IC 130 is offset on the substrate in a perpendicular direction (D1 in the figure) with respect to the first group of memory modules 110. The second group of memory modules 120 is offset, by a first distance DT1 in the direction D1, on the substrate with respect to the first group of memory modules 110. This distance DT1 may vary as desired because the second group of memory modules 120 is spaced in the direction D3 from the first group of memory modules 110, as opposed to a conventional case in which first and the second groups of memory modules are aligned in directions corresponding to directions D1, D2 in the figure.

In this embodiment, however, as mentioned above, the second group of memory modules 120 is not only spaced from the first group of memory modules 110 on the substrate in one direction D3 but is offset by a distance DT1 in a direction D1 orthogonal to direction D3. Accordingly, a relatively simple layout of electrical wirings may be employed to connect the groups of memory modules 110 and 120 to the main IC 130.

Furthermore, in another example of this embodiment, the memory module set 100 includes an additional group(s) of memory modules, each of which is spaced on the substrate in the direction D3 from and offset in the direction D1 by distance DT1 with respect to the group of memory modules closest thereto in direction D4.

The first group of memory modules 110 may include a plurality of memory modules aligned on the substrate in the directions D3, D4. In this regard, each of the memory modules may include memory pins by which the data stored in the module can be accessed. The memory pins of each memory module may be aligned side by side in the directions D1, D2. Thus, the electrical wires that connect a memory module of the first group of memory modules 110 to the main IC 130 may have substantially the same length. The second group of memory modules 120 may include a plurality of memory modules aligned on the substrate in the directions D3, D4. In this regard, each of the memory modules may include memory pins by which the data stored in the module can be accessed. The memory pins of each memory module of the second group may also be aligned side by side in the directions D1, D2. Thus, the electrical wires that connect a memory module of the second group to the main IC 130 may have substantially the same length.

FIG. 2 is a diagram of another layout of a memory module set 200 on a substrate (e.g., motherboard) according to the inventive concept.

Referring to FIG. 2, the memory module set 200 includes a first group of memory modules 210, a third group of memory modules 220 (of types different from those of the first and second groups in the embodiment of FIG. 1), and a main IC 230. The first group of memory modules 210 includes at least one memory module (not shown) and a first pin unit 215 comprising a block of memory pins. The third group of memory modules 220 includes at least one memory module (not shown) and a third pin unit 225 comprising a block of memory pins. The memory modules of the first group of memory modules 210 and of the third group of memory modules 220, and the main IC 230, are similar to those respectively described in detail with reference to FIG. 1 above and thus will not be described again here in detail.

With regard to the layout of the memory module set 200, the first group of memory modules 210 may be spaced in the direction D3 from the main IC 230. A third group of memory modules 220 may be disposed on the substrate as spaced in the direction D4 from and offset by distance DT2 in the direction D2 with respect to the first group of memory modules 210. This distance DT2 is flexible in the case in which the third group of memory modules 220 is disposed in the direction D4 from the first group of memory modules 210. Unlike a conventional case in which the groups of memory modules are aligned in directions corresponding to directions D3, D4, the third group of memory modules 220 is offset by the distance DT2 with respect to the first group of memory modules 210, thereby allowing for a relatively simple scheme for the electrical wires used for connecting to the modules to the main IC 230. As was the case with the layout shown in FIG. 1, the memory module set 200 may include an additional group(s) of memory modules, each group being spaced on the substrate in the direction D4 from and offset by the distance DT2 in the direction D2 with respect to the group of memory modules closest thereto in the direction D3. The first distance DT1 of the layout shown in FIG. 1 and the second distance DT2 may have the same or different values.

The first group of memory modules 210 may include a plurality of memory modules aligned on the substrate in the direction D3, D4. In this regard, each of the memory modules may include memory pins by which data stored in the module can be accessed. The memory pins of each memory module may be aligned side by side in the directions D1, D2. Thus, the electrical wires that connect a memory module of the first group of memory modules 210 to the main IC 230 may have substantially the same length. The third group of memory modules 220 may include a plurality of memory modules each aligned on the substrate in the directions D3, D4. In this regard, each of the memory modules may include memory pins by which data stored in the module can be accessed. The memory pins of each memory module may be aligned side by side in directions D1, D2. Thus, the electrical wires that connect a memory module of the third group of memory modules 220 to the main IC 230 may have substantially the same length.

FIG. 3 is a diagram of a layout of another embodiment of a memory module set 300, which may be derived from the layouts of FIGS. 1 and 2 when it is desired to use three groups of memory modules, for example.

Referring to FIG. 3, the memory module set 300 includes a first group of memory modules 310, a second group of memory modules 320, a third group of memory modules 330, and a main IC 340. The first group of memory modules 310 includes at least one memory module (not shown) and a first pin unit 315 comprising a block of memory pins. The second group of memory modules 320 includes at least one memory module (not shown) and a second pin unit 325 comprising a block of memory pins. The third group of memory modules 330 includes at least one memory module (not shown) and a third pin unit 335 comprising a block of memory pins. The first group of memory modules 310, the second group of memory modules 320, and the third group of memory modules 330 and the main IC 340 are respectively similar to those described in detail with reference to FIGS. 1 and 2.

The first group of memory modules 310 may be spaced in the direction D3 from the main IC 340. The second group of memory modules 320 may be spaced on the substrate in the direction D3 from and offset by first distance DT1 in direction D1 with respect to the first group of memory modules 310. The third group of memory modules 330 may be spaced on the substrate in the direction D4 from and offset by second distance DT2 with respect to the first group of memory modules 310. Another group of memory modules (not shown) may be spaced on the substrate in the direction D3 from and by the first distance DT1 in the direction D1 with respect the second group of memory modules 320. Another group of memory modules (not shown) may be spaced on the substrate in the direction D4 from and offset by the second distance DT2 in the direction D2 with respect to the third group of memory modules 330. The first distance DT1 and the second distance DT2 may have the same or different values.

Unlike a conventional case in which the groups of memory modules are aligned in directions corresponding to directions D3, D4, the second group of memory modules 320 and the third group of memory modules 330 are offset by the first distance DT1 and the second distance DT2, respectively, with respect to the first group of memory modules 310. Therefore, the memory modules of the first, second and third groups 310, 320 and 33 may be easily and wired to the main IC 340, i.e., a relatively simple scheme of wires may be used to electrically connect the modules to the main IC 340.

The first group of memory modules 310 may include a plurality of memory modules aligned on the substrate in directions D3, D4. In this regard, each of the memory modules may include memory pins by which data stored in the module can be accessed. The memory pins of each memory module may be aligned side by side in directions D1, D2. Thus, the electrical wires that connect a memory module of the first group of memory modules 310 to the main IC 340 may have substantially the same length. The second group of memory modules 320 may include a plurality of memory modules aligned on the substrate in the directions D3, D4. Each of the memory modules of the second group may also include memory pins by which data stored in the module can be accessed. The memory pins of each memory module may be aligned side by side in directions D1, D2. Thus, the electrical wires that connect a memory module of the second group of memory modules 320 to the main IC 340 may have substantially the same length. The third group of memory modules 330 may include a plurality of memory modules aligned in straight lines on the substrate in directions D3, D4. Each of the memory modules of the third group may include memory pins by which data stored in the module can be accessed. The memory pins of each memory module may be aligned side by side in directions D1, D2. Thus, the electrical wires that connect to a memory module of the third group of memory modules 330 may have substantially the same length.

In this case in which wires of different lengths connect a memory module to an IC, a distortion may occur in a signal transmitted between the module and the IC. On the other hand, as mentioned above with respect to FIGS. 1-3, the memory pins of any memory module of a particular group of memory modules may be aligned side by side in directions D1, D2. Thus, a layout of main memory modules and an IC according to the inventive concept may prevent a distortion of a signal transmitted between a module and the IC.

Figure 4A:
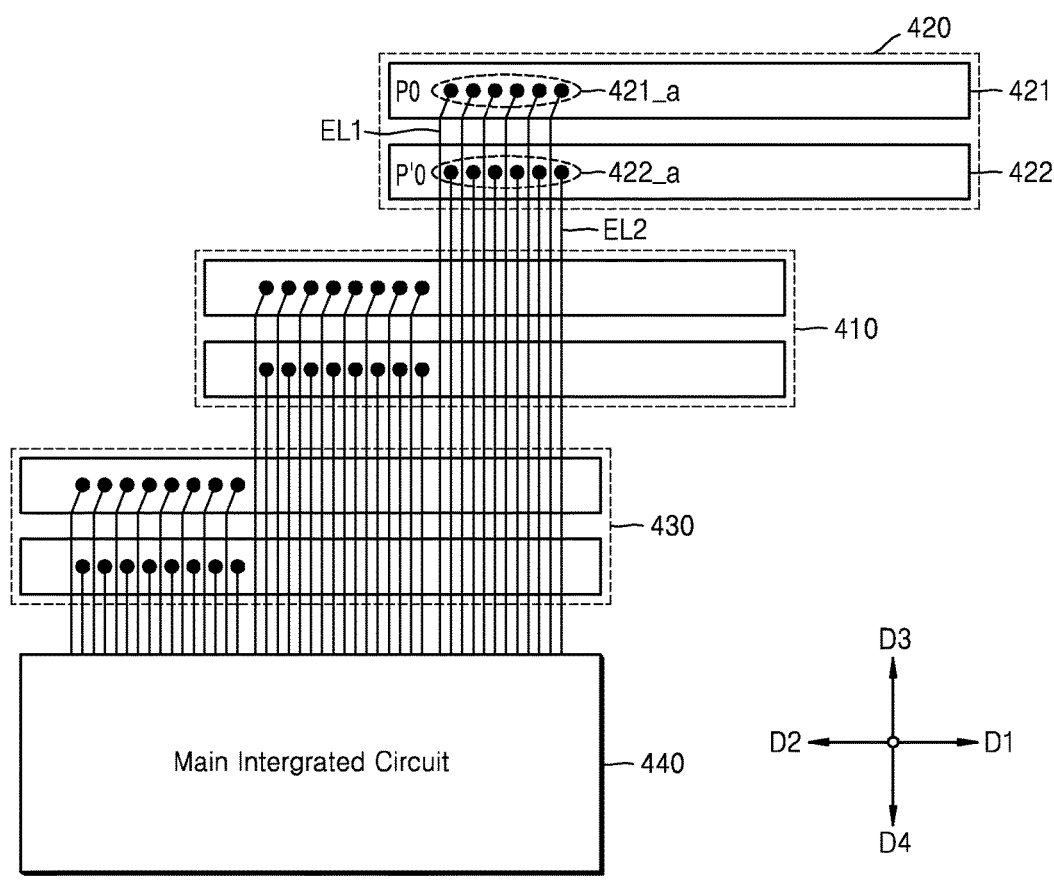
FIG. 4A is a diagram of a layout of another embodiment of a memory module set according to the inventive concept.

FIG. 4A illustrates the layout of another embodiment of a memory module set 400, i.e., illustrates components of the memory module set 400 on its substrate, according to the inventive concept.

Referring to FIG. 4A, the memory module set 400 includes a first group of memory modules 410, a second group of memory modules 420, a third group of memory modules 430, and a main IC 440. The footprints of the groups of memory modules are shown by dashed lines. The layout of the memory modules of the memory module set 400 has been described in detail with reference to FIG. 3 and thus, will not be described again here in detail. The second group of memory modules 420 includes a first memory module 421 and a second memory module 422 but the second group may have two memory modules in this embodiment. The first memory module 421 includes a first memory pin 421_a set for accessing data stored in the first memory module 421. The second memory module 422 includes a second memory pin 422_a set for accessing data stored in the second memory module 422. The first memory pin 421_a set and the second memory pin 422_a set each may include a plurality of memory pins. Each memory pin P0 of the first memory pin 421_a set and each memory pin P'0 of the second memory pin 422_a set may be disposed upright on the substrate. The main IC 440 and the first memory pin 421_a set are connected to each other via first electrical wiring EL1, and the main IC 440 and the second memory pin 422_a set are connected to each other via second electrical wiring EL2.

The numbers of discrete electrical wires of the first electrical wiring EL1 and the second electrical wiring EL2 may be the same, respectively, as the numbers of memory pins of the first memory pin 421_a set and the second memory pin 422_a set but the inventive concept is not limited to such a one-to-one correspondence. The electrical wires of the first electrical wiring EL1 may have the same length. The electrical wires of the second electrical wiring EL2 may have the same length, thereby preventing a signal distortion which could otherwise occur if the lengths of the wires associated with each memory module were different, and thereby facilitating an optimal memory operation performed by the module set 400.

The first group of memory modules 410 and the third group of memory modules 430 may each have a configuration similar to that of the second group of memory modules 420.

Figure 4B:
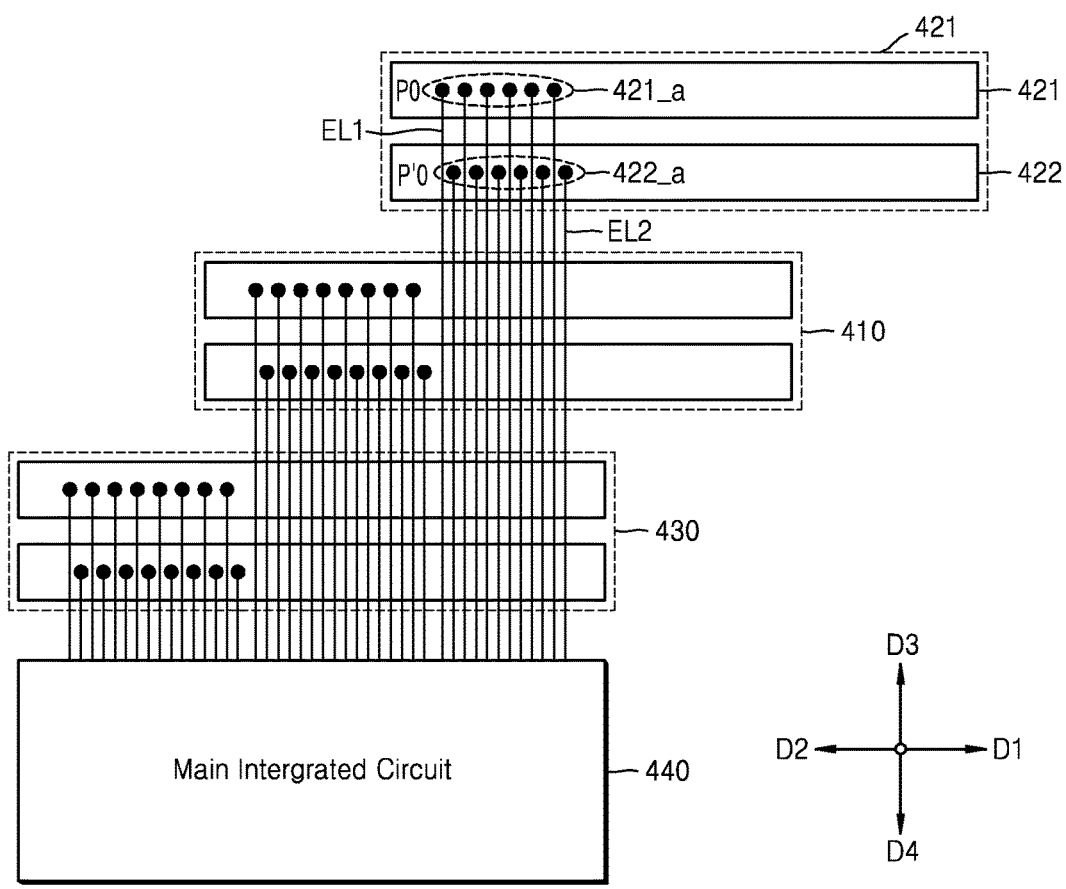
FIG. 4B is a diagram of a layout of an embodiment of a memory module set similar to that of FIG. 4A but employing another example of memory modules according to the inventive concept.

FIG. 4B illustrates another example of the layout of the module set 400 according to the inventive concept.

Referring to FIG. 4B, the second group of memory modules 420 includes the first memory module 421 and the second memory module 422 but again is not limited to having only two memory modules. The first memory module 421 includes the first memory pin 421_a set for accessing data stored in the first memory module 421. The second memory module 422 includes the second memory pin 422_a set for accessing data stored in the second memory module 422. The main IC 440 and the first memory pin 421_a set are connected to each other via the first electrical wiring EL1. The main IC 440 and the second memory pin 422_a set are connected to each other via the second electrical wiring EL2. In this example, the first electrical wiring EL1 and second electrical wiring EL2 each consist of a plurality of discrete parallel straight wires. To facilitate the use of such straight wires, the second memory module 422 (or more specifically, the memory pin 422_a set thereof) may be offset (in the direction D1 in the figure) with respect to (the memory pin 421_a of) the set first memory module 421. The configuration of each of the first group of memory modules 410 and the third group of memory modules 430 may be similar to that of the second group of memory modules 420.

Figure 5A:
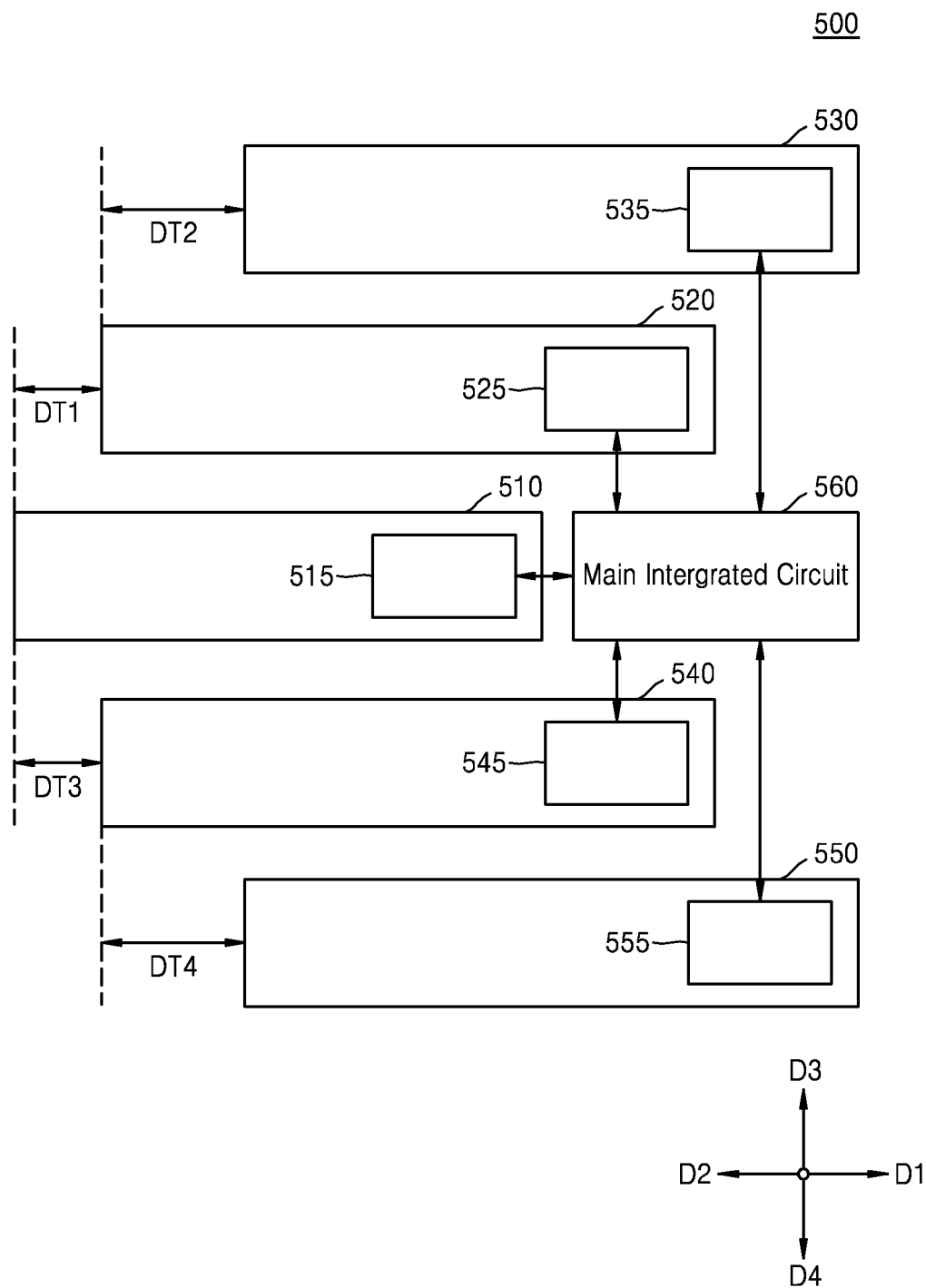
FIG. 5A is a diagram of a layout of another embodiment of a memory module set according to the inventive concept.

FIG. 5A illustrates the layout of another embodiment of a memory module set 500, i.e., components of the module set 500 on its substrate, according to the inventive concept.

Referring to FIG. 5A, the memory module set 500 includes a first group of memory modules 510, a second group of memory modules 520, a third group of memory modules 530, a fourth group of memory modules 540, a fifth group of memory modules 550, and a main IC 560. The memory modules of each group and the main IC 560 are similar to those described above and thus, will not be described here in detail again.

With regard to the layout of the memory module set 500, the first group of memory modules 510 may be offset in the direction D2 from the main IC 560. The second group of memory modules 520 may be spaced in the direction D3 from the first group of memory modules 510 and offset by first distance DT1 in the direction D1 with respect to the first group of memory modules 510. The third group of memory modules 530 may be spaced in the direction D3 from the second group of memory modules 520 and offset by second distance DT2 in the direction D1 with respect to the second group of memory modules 520. The fourth group of memory modules 540 may be spaced in the direction D4 from the first group of memory modules 510 and offset a third distance DT3 with respect to the first group of memory modules 510. The fifth group of memory modules 550 may be spaced in the direction D4 from the fourth group of memory modules 540 and offset by fourth distance DT4 in the direction D1 with respect to the fourth group of memory modules 540. Thus, the groups of memory modules may have a radial layout with respect to the main IC 560. In the radial layout, the memory modules may be oriented such that they are arranged in the pattern of a chevron pointing in direction D2 in this example.

Moreover, the memory module set 500 of this embodiment is not limited to the number of groups of memory modules shown but may have other numbers of groups of memory modules arranged according to the scheme of the layout described above.

The first through fourth distances DT1, DT2, DT3, and DT4 may be the same or different.

Conventionally, respective groups of the memory modules would be aligned. However, in this embodiment, each of the second group of memory modules 520, the third group of memory modules 530, the fourth group of memory module 540, and the fifth group of memory modules 550 that are conventionally aligned in straight lines, each group of memory modules are offset from each other and/or the main IC 560 in such a way as to simplify the scheme of the electrical wirings for connecting groups of memory modules to the main IC 560. The second group of memory modules 520 may include a plurality of memory modules aligned in direction D3 or D4. In this regard, each of the memory modules may include a set of memory pins through which stored data can be accessed. The memory pins of each of the memory modules may be aligned in the direction D1 or D2 (similar to either case shown in and described with reference to FIGS. 4A and 4B). Thus, the electrical wires that connect to each of the memory modules of the second group of memory modules 520 to the main IC 560 may have substantially the same length, thereby preventing a signal distortion which could otherwise occur if the lengths of the wires were different. The third group of memory modules 530, the fourth group of memory module 540, and the fifth group of memory modules 550 may be configured similarly, in these respects, to the first group of memory modules 510.

Figure 5B:
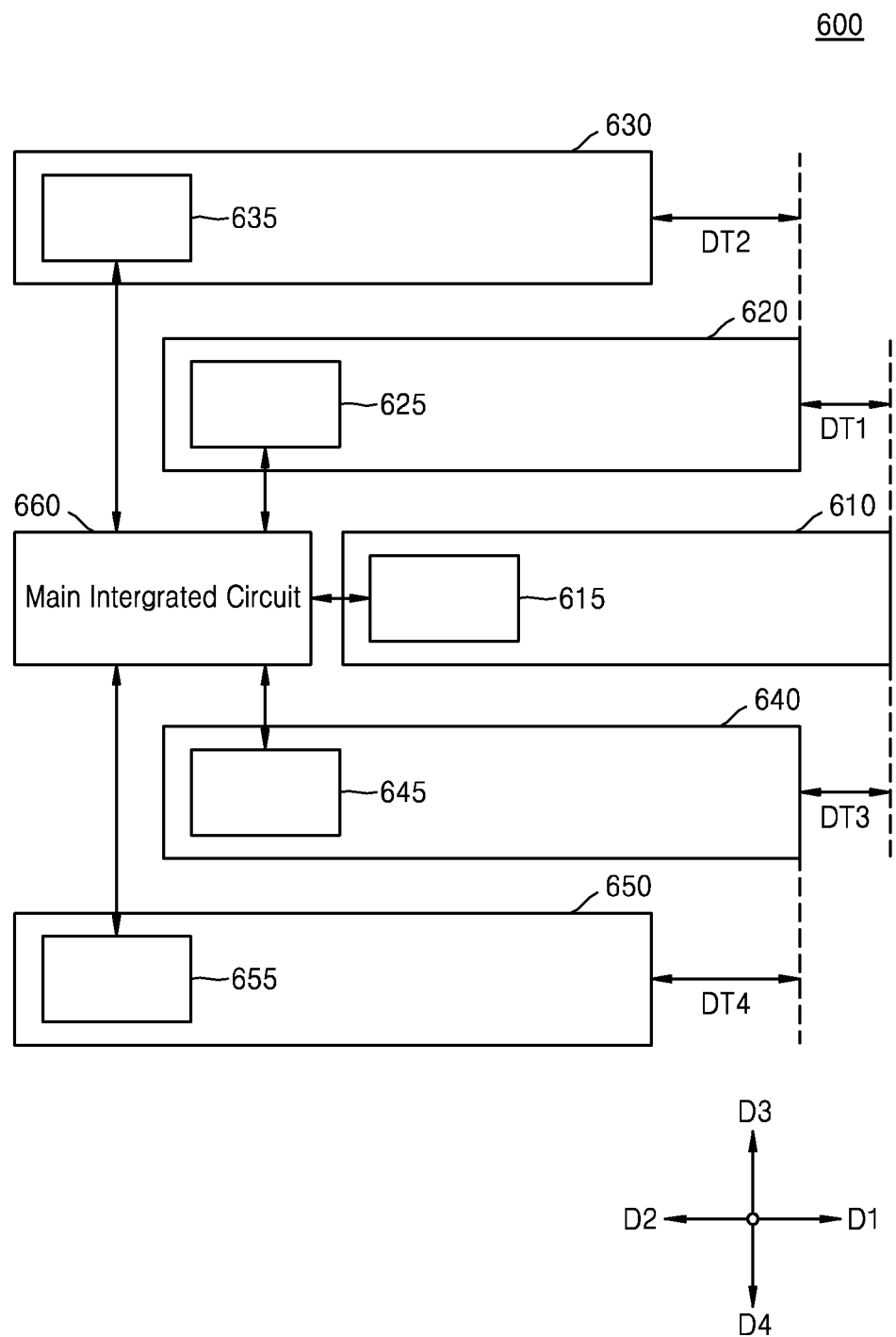
FIG. 5B is a diagram of a layout of another embodiment of a memory module set according to the inventive concept.

FIG. 5B illustrates the layout of another embodiment of a memory module set 600 according to the inventive concept.

Referring to FIG. 5B, the memory module set 500 includes a first group of memory modules 610, a second group of memory modules 620, a third group of memory modules 630, a fourth group of memory module 640, a fifth group of memory modules 650, and a main IC 660. The memory modules of each memory module group and the main IC 660 are similar to the memory modules and main IC shown in and described in detail with reference to FIG. 1 and thus will not be described again here in detail.

With regard to the layout of the memory module set 600, the first group of memory modules 610 may be spaced in the direction D1 from the main IC 660. The second group of memory modules 620 may be spaced in the direction D3 from the first group of memory modules 610 and offset by first distance DT1 in the direction D2 with respect to the first group of memory modules 610. The third group of memory modules 630 may be spaced in the direction D3 from the second group of memory modules 620 and offset by second distance DT2 in the direction D2 with respect to the second group of memory modules 620. The fourth group of memory modules 640 may be spaced in the direction D4 of the first group of memory modules 610 and offset by third distance DT3 in the direction D2 with respect to the first group of memory modules 610. The fifth group of memory modules 650 may be spaced in the direction D4 of the fourth group of memory modules 640 and offset by fourth distance DT4 in the direction D2 with respect to the fourth group of memory modules 640. Thus, the memory module set 600 may have a layout in which its memory modules radiate with respect to the main IC 660.

That is, the groups of memory modules may have a radial layout with respect to the main IC 660. In the radial layout, the memory modules may be oriented such that they are arranged in the pattern of a chevron pointing in direction D2 in this example. Moreover, the memory module set 600 may include a group(s) of memory modules in addition to those described above but otherwise also arranged in the radial scheme described. The other features of the module set 600, i.e., the pins, wiring, etc. are similar to those described with reference to the embodiment of FIG. 5A, and thus will not be described here again in further detail.

FIG. 6 is a diagram of a layout of an embodiment of a semiconductor memory system 700, i.e., of components of the system 700 on its substrate, according to the inventive concept.

Referring to FIG. 6, the semiconductor memory system 700 includes a first memory module set 700_a and a second memory module set 700_b. The first memory module set 700_a may have a radial layout in which a plurality of groups of memory modules 705, 710, 715, 720, and 725 radiate with respect to a first main IC 760 similarly to the layout shown in FIG. 5A. The second memory module set 700_b may also have a radial layout. In particular, the second memory module set 700_b may also include a plurality of groups of memory modules 730, 735, 740, 745, and 750 that radiate with respect to a second main IC 770 similarly to the layout shown in FIG. 5A. The second memory module set 700_b may be disposed directly adjacent the first memory module set 700_a in the direction D4. Also, the first and second memory module sets 700_a and 700_b may each include one or more additional groups of memory modules as has been mentioned above.

According to another embodiment, the first memory module set 700_a may have a radial layout in which the groups of memory modules 705, 710, 715, 720, and 725 radiate with respect to the first main IC 760 similarly to the embodiment of FIG. 5B. The second memory module set 700_b may also have a radial layout in which the groups of memory modules 730, 735, 740, 745, and 750 radiate with respect to the second main IC 770 similarly to the embodiment of FIG. 5B.

In any case, the memory modules may have a zig-zag pattern along the third and fourth directions D3, D4.

FIG. 7 illustrates a layout of another embodiment of a semiconductor memory system 800 according to the inventive concept.

Referring to FIG. 7, the semiconductor memory system 800 includes a first memory module set 800_a and a second memory module set 800_b. The first memory module set 800_a may have a radial layout in which a plurality of groups of memory modules 805, 810, 815, 820, and 825 radiate with respect to a first main IC 860 similarly to the embodiment of FIG. 5A. The second memory module set 800_b may have a radial layout in which groups of memory modules 830, 835, 840, 845, and 850 radiate with respect to a second main IC 870 similarly to the embodiment of FIG. 5B. The second memory module set 800_b may be disposed directly adjacent the first memory module set 800_a in the direction D4 of. Also, the first and second memory module sets 800_a and 800_b may each include at least one additional group of memory modules also disposed in the radial array described above.

According to another embodiment, the first memory module set 800_a may have a radial layout in which the groups of memory modules 805, 810, 815, 820, and 825 radiate with respect to the first main IC 860 similarly to the embodiment of FIG. 5B. The second memory module set 800_b may have a radial layout in which the groups of memory modules 830, 835, 840, 845, and 850 radiate with respect to the second main IC 870 similarly to the embodiment of FIG. 5A.

In any case, like the embodiment of FIG. 6, the memory modules may have a zig-zag pattern along the third and fourth directions D3, D4.

Figure 8:
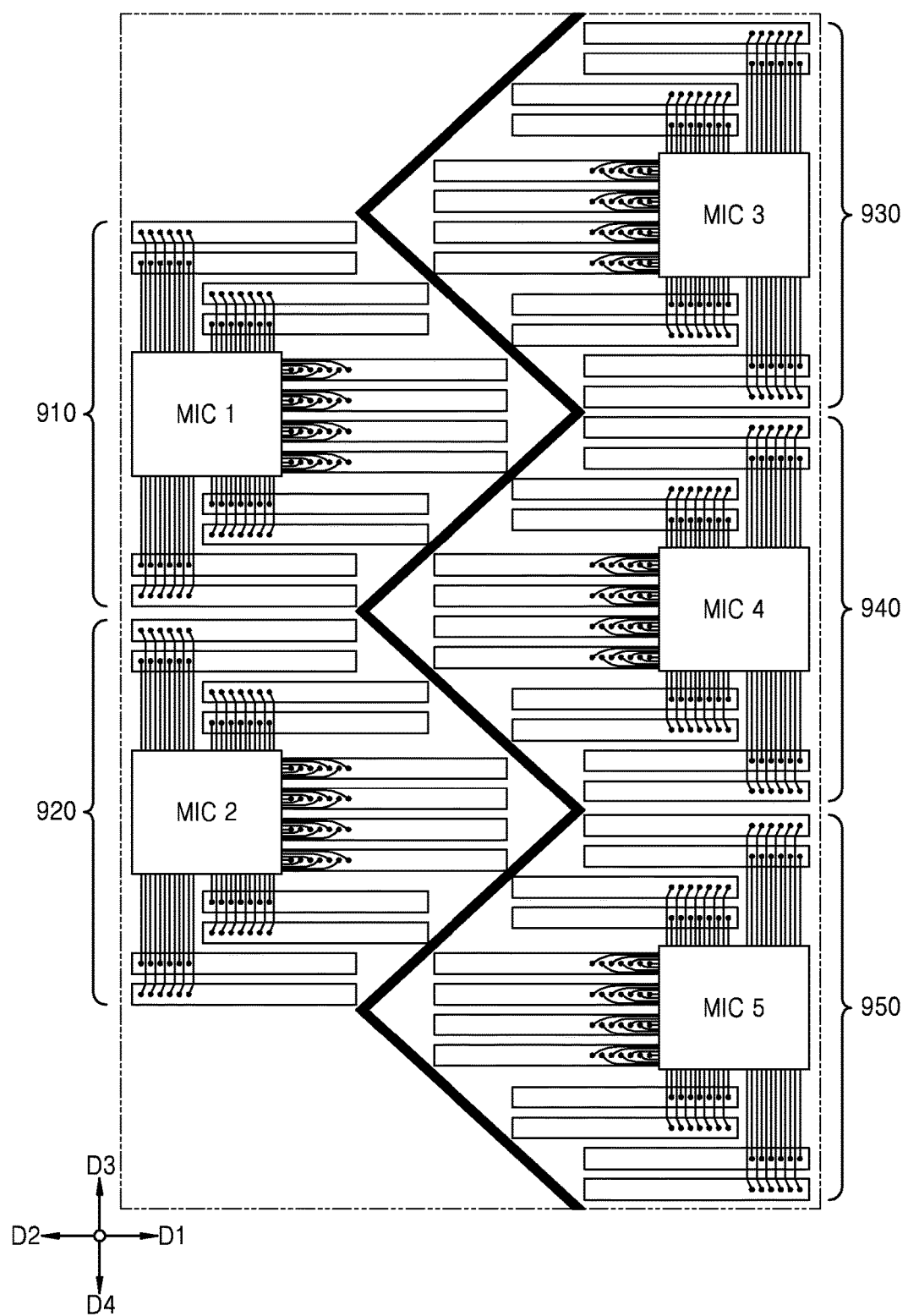
FIG. 8 is a diagram of a layout of another embodiment of a semiconductor memory system according to the inventive concept.

FIG. 8 illustrates a semiconductor memory system 900 and, in particular, the layout of its components on its substrate (e.g., a motherboard), according to the inventive concept.

Referring to FIG. 8, the semiconductor memory system 900 includes a first memory module set 910, a second memory module set 920, a third memory module set 930, a fourth memory module set 940, and a fifth memory module set 950 but may include additional or fewer memory module sets. The first memory module set 910 and the second memory module set 920 may have a radial layout in which groups of memory modules radiate on the substrate with respect to its main IC similarly to the embodiment of FIG. 5B. The first memory module set 910 and the second memory module set 920 may be disposed adjacent each other along the left-hand side on the substrate of the semiconductor memory system 900.

The third memory module set 930, the fourth memory module set 940, and the fifth memory module set 950 may each have a radial layout in which groups of memory modules radiate on the substrate with respect to its main IC similarly to the embodiment of FIG. 5A. The third memory module set 930, the fourth memory module set 940, and the fifth memory module set 950 may be disposed adjacent each other along the right-hand of the substrate of the semiconductor memory system 900.

Additional memory module sets may be disposed along the left-hand side of the substrate if configured similarly to the embodiment of FIG. 5B. To the contrary, additional memory module sets may be disposed along the right-hand side of the substrate is configured similarly to the embodiment of FIG. 5A.

In any case, the embodiment of FIG. 8 may have memory modules arranged in zig-zag patterns along the third and fourth directions D3, D4 at opposite sides of the substrate, respectively.

Figure 9:
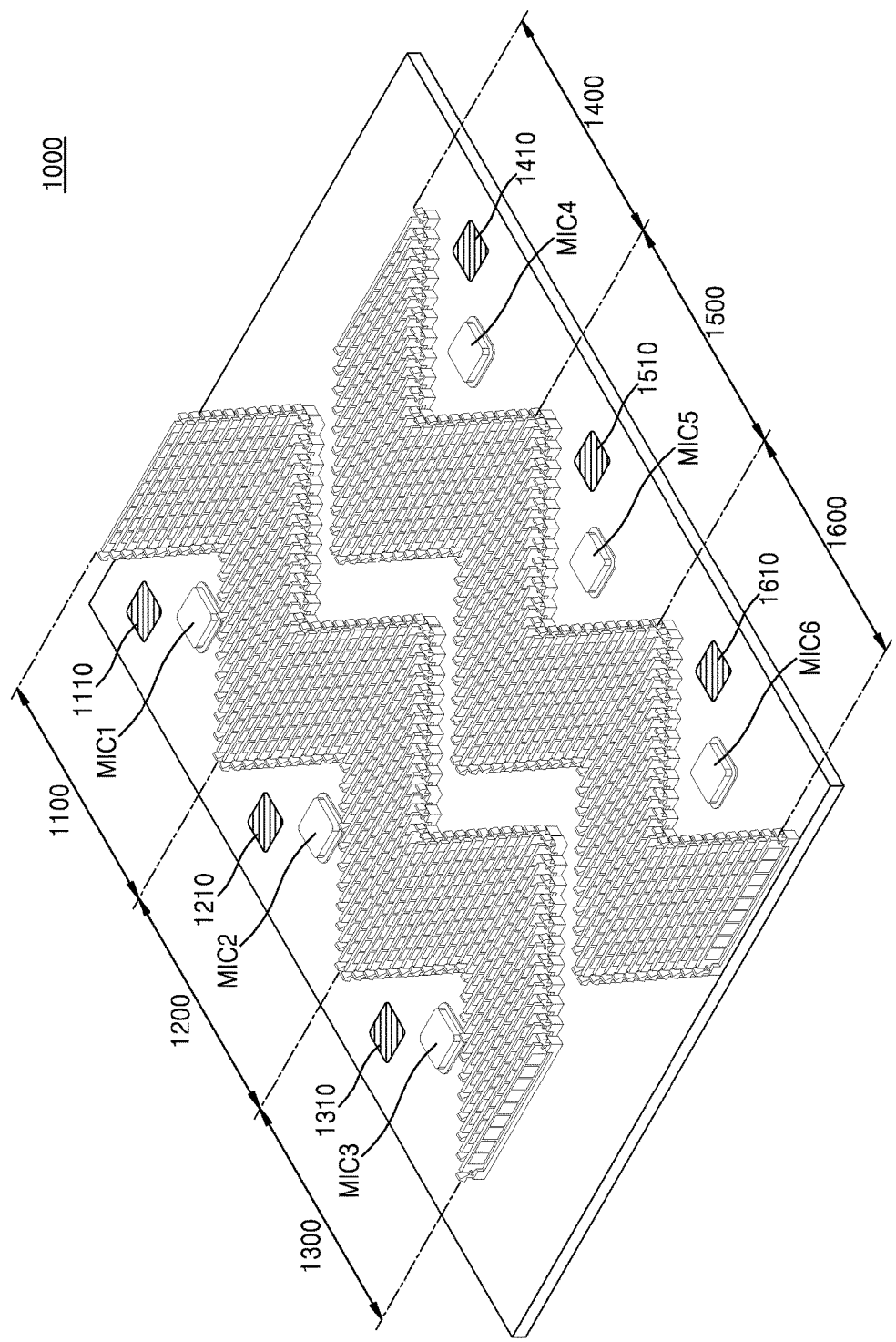
FIG. 9 is a diagram of a 3D layout of an embodiment of a semiconductor memory system according to the inventive concept.

FIG. 9 is a diagram of a 3D layout of a semiconductor memory system 1000 according to the inventive concept.

Referring to FIG. 9, the semiconductor memory system 1000 includes a first memory module set 1100, a second memory module set 1200, a third memory module set 1300, a fourth memory module set 1400, a fifth memory module set 1500, and a sixth memory module set 1600. Groups of memory modules of the first memory module set 1100, the second memory module set 1200, and the third memory module set 1300 may radiate on the substrate with respect to a first main IC MIC1, a second main IC MIC2, and a third main IC MIC3, respectively. Groups of memory modules of the fourth memory module set 1400, the fifth memory module set 1500, and the sixth memory module set 1600 may radiate on the substrate with respect to a fourth main IC MIC4, a fifth main IC MIC5, and a sixth main IC MIC6, respectively. Although each group of memory modules is shown as having only one memory module for convenience of illustration, each group of memory modules may include a plurality of memory modules as in the embodiment of FIGS. 6-8.

Furthermore, similarly to the embodiment of FIG. 8, this embodiment may have memory modules arranged in zig-zag patterns along the third and fourth directions D3, D4 at opposite sides of the substrate, respectively.

In addition, in this embodiment of a semiconductor memory system 1000, extra space 1110, 1210, 1310, 1410, 1510, and 1610 may exist on the substrate (e.g., a motherboard) near each main IC MIC1~MIC6. For convenience, only some of the extra space is designated by the reference numerals 1110, 1210, 1310, 1410, 1510, and 1610 but the extra space encompasses all that on the substrate not occupied by the main ICs MIC1~MIC6, memory modules and wiring connecting the same. Accordingly, at least one chip may be disposed in each of the extra spaces 1110, 1210, 1310, 1410, 1510, and 1610 in addition to the memory modules. For example, the chip may constitute a graphic card or a sound card. The extra space may include all that space on the substrate to the left of the main ICs MIC1~MIC3 of the first through third memory module sets 1100, 1200, and 1300 as well as all that space on the substrate to the right of the main ICs MIC4~MIC6 of the fourth through sixth memory module sets 1400, 1500, and 1600 in the orientation depicted in the figure. Thus, at least one chip may be disposed in this extra space and in such an embodiment according to the inventive concept, the space on the substrate is used very efficiently.

Figure 10:
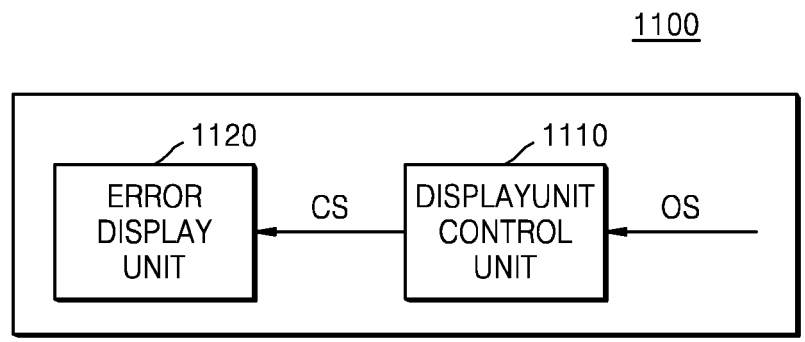
FIG. 10 is a block diagram of an embodiment of a memory module according to the inventive concept.

FIG. 10 is a block diagram of an example of a memory module 1100.

Referring to FIG. 10, the memory module 1100 may constitute a memory module of any group or groups of memory modules of the embodiments described above and include a display control unit 1110 and an error display unit 1120. The display control unit 1110 may receive an operating signal OS of each of memory chips of the memory module 1100. In this regard, when a problem in at least one of the memory chips occurs and the operating signal OS of the memory chip is not received, the display control unit 1110 may provide a control signal CS to the error display unit 1120. The error display 1120 may display that an error is present in an operation of the memory module 1100 based on the control signal CS. As an example of this embodiment, the error display unit 1120 may be configured as a light emitting diode (LED) that may emit light to display that the error is present in the memory module 1100.

Figure 11:
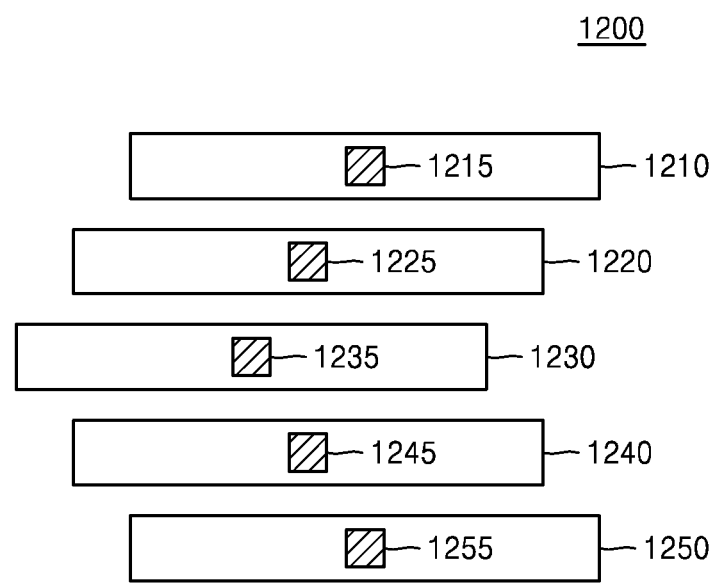
FIG. 11 is a schematic diagram of an embodiment of a semiconductor memory system according to the inventive concept.

FIG. 11 is a schematic diagram of an embodiment of a semiconductor memory system 1200 according to the inventive concept.

Referring to FIG. 11, the semiconductor memory system 1200 includes memory module groups each including one memory module corresponding to the memory module 1100 described with reference to FIG. 10 above. However, each memory module group will be simply referred to as a memory module hereinafter for ease of description.

The semiconductor memory system 1200 includes a first memory module 1210, a second memory module 1220, a third memory module 1230, a fourth memory module 1240, and a fifth memory module 1250. The first memory module 1210, the second memory module 1220, the third memory module 1230, the fourth memory module 1240, and the fifth memory module 1250 respectively include a first error display unit 1215, a second error display unit 1225, a third error display unit 1235, a fourth error display unit 1245, and a fifth error display unit 1255. The layout of this system 1200 is the same as that of the embodiment of FIG. 5A. The first error display unit 1215 may be disposed in a central portion of the first memory module 1210. The second through fifth memory modules 1220-1250 may be similarly disposed. Thus, the first error display unit 1215 and the second error display unit 1225 may be offset by a distance corresponding to the offset between the first memory module 1220 and the second memory module 1225. In this way, it may be easier to discern which memory module is experiencing an error in its operation than if the error display units were disposed along a straight line (even in the case in which each memory module group includes two or more memory modules).

Figure 12:
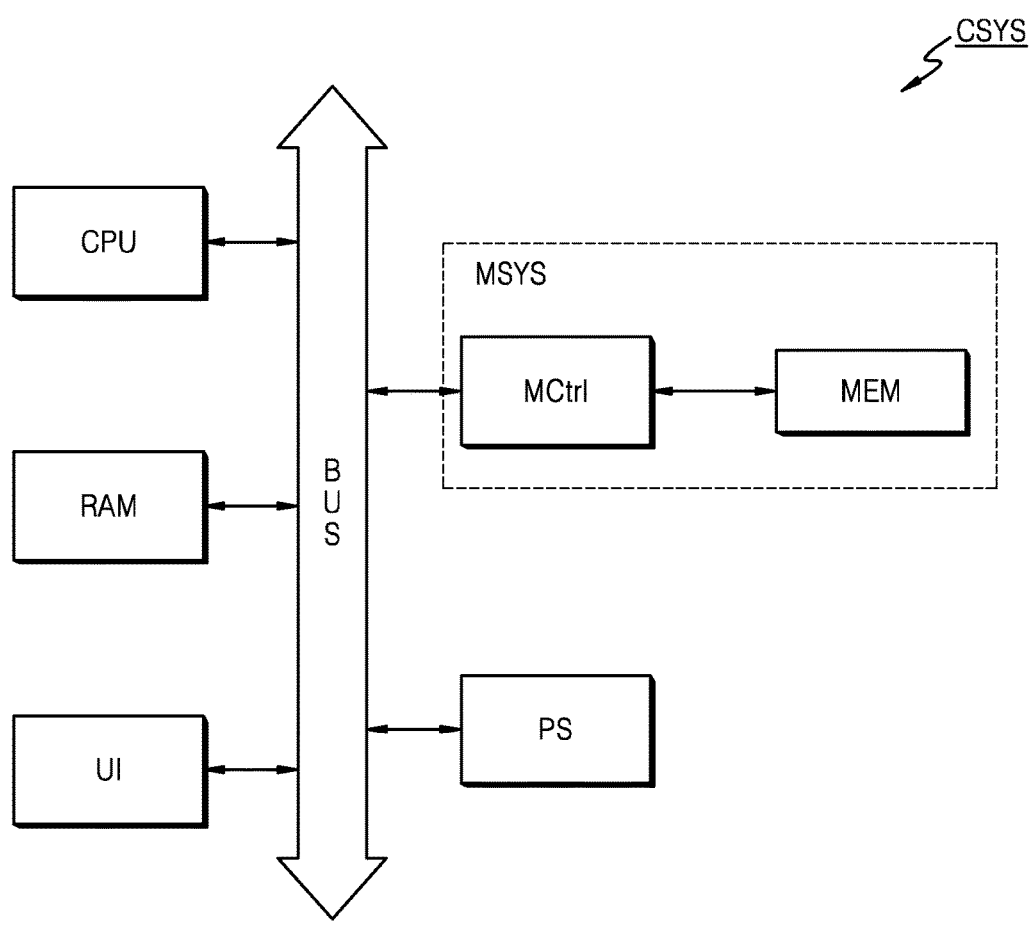
FIG. 12 is a block diagram of an embodiment of a computing system device according to the inventive concept.

FIG. 12 is a block diagram of an embodiment of a computing system device CSYS according to the inventive concept.

The computing system device CSYS includes a processor CPU, a user interface UI, and a memory system MSYS that are electrically connected to a bus BUS. The memory system MSYS includes a controller Ctrl and a memory MEM. The memory system MSYS may have a configuration corresponding to that of the embodiment of FIG. 5A. More particularly, the memory MEM may include a plurality of memory module sets of the type described with reference to FIG. 5A, and the memory module sets may include a plurality of memory module groups and main ICs. Thus, the memory system MSYS of the computing system device CSYS may exhibit relatively high performance without the need for an additional module. Furthermore, the memory system MSYS may be a flash memory system, and the memory MEM may include a plurality of flash memory modules.

When the computing system device CSYS is a mobile device, a battery for supplying an operating voltage of the computing system device CSYS and a modem such as a baseband chipset may be additionally provided. It will be obvious to one of ordinary skill in the art that the computing system device CSYS may also have an application chipset, a camera image processor (CIS), a mobile DRAM, etc.

Figure 13:
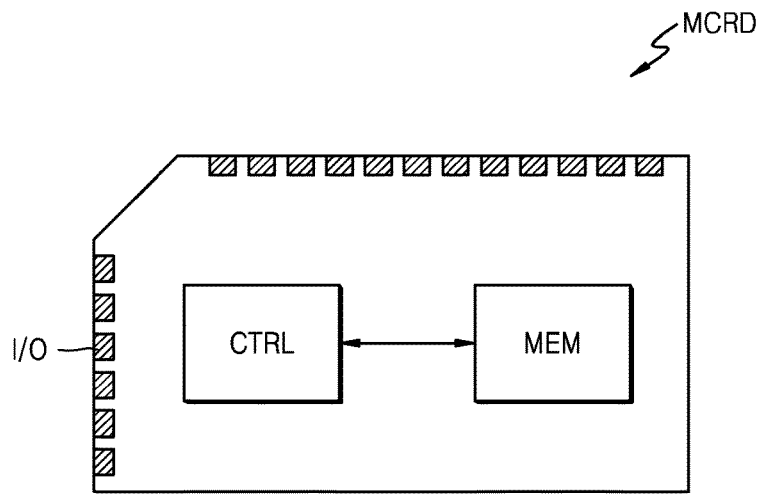
FIG. 13 is a block diagram of an embodiment of a memory card according to the inventive concept.

FIG. 13 is a block diagram of an embodiment of a memory card MCRD according to the inventive concept.

Referring to FIG. 13, the memory card MCRD includes memory controller Ctrl and memory MEM. The memory controller Ctrl controls a write or read operation of writing or reading data to or from the memory MEM in response to a request of an external host (not shown) received from an input and output means I/O. The memory controller Ctrl controls an erasure operation on the memory MEM. The memory MEM may include a plurality of memory module sets each of the type described with reference to FIG. 5A. The memory module sets may include a plurality of memory module groups and main ICs and may be disposed as described the embodiments above which employ plural memory module sets. The memory controller Ctrl may include interfaces (not shown) for interfacing with hosts and memory devices and RAM, etc. to perform a control operation on the memory MEM.

The memory card MCRD of FIG. 13 may be realized as a compact flash card (CFC), a micro drive, a smart media card (SMC), a multimedia card (MMC), a security digital card (SDC), a memory stick, a USB flash memory driver, etc. Thus, the memory card MCRD may exhibit high performance without any additional module.

Figure 14:
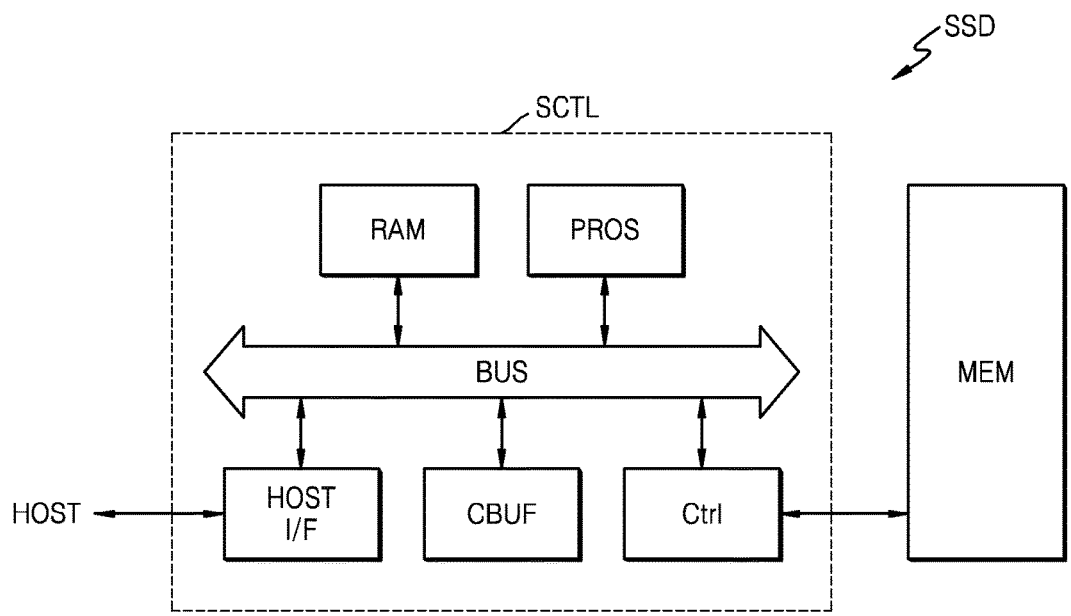
FIG. 14 is a block diagram of an embodiment of a solid state drive (SSD) according to the inventive concept.

FIG. 14 is a block diagram of an embodiment of a solid stated drive (SSD) according to the inventive concept.

Referring to FIG. 14, the SSD includes an SSD controller SCTL and flash memory MEM. The SSD controller SCTL may include a processor PROS, a random access memory RAM, a cache buffer CBUF, and memory controller Ctrl that are connected via a bus BUS. The processor PROS controls the memory controller Ctrl to transmit and receive data to and from the flash memory MEM in response to a request (command, address, and data) of a host (not shown). Data necessary for operating the processor PROS may be loaded onto the RAM.

A host interface HOST I/F receives the request of the host to transmit the request to the processor PROS or transmits data transmitted from the flash memory MEM to the host. The host interface HOST I/F may interface with the host using various interface protocols such as USB (Universal Serial Bus), MMC (Man Machine Communication), PCI-E (Peripheral Component Interconnect-Express), SATA (Serial Advanced Technology Attachment), PATA (Parallel Advanced Technology Attachment), SCSI (Small Computer System Interface), ESDI (Enhanced Small Device Interface), and IDE (Intelligent Drive Electronics). Data that is to be transmitted or is transmitted from the flash memory MEM may be temporarily stored in the cache buffer CBUF. The cache buffer CBUF may be an SRAM.

The SSD and, in particular, the flash memory MEM of the SSD, may employ a semiconductor memory system of the type described with reference to FIG. 5A. Thus, the memory modules of the flash memory MEM may facilitate a relatively high performance operation of the SSD without any additional module.

Figure 15:
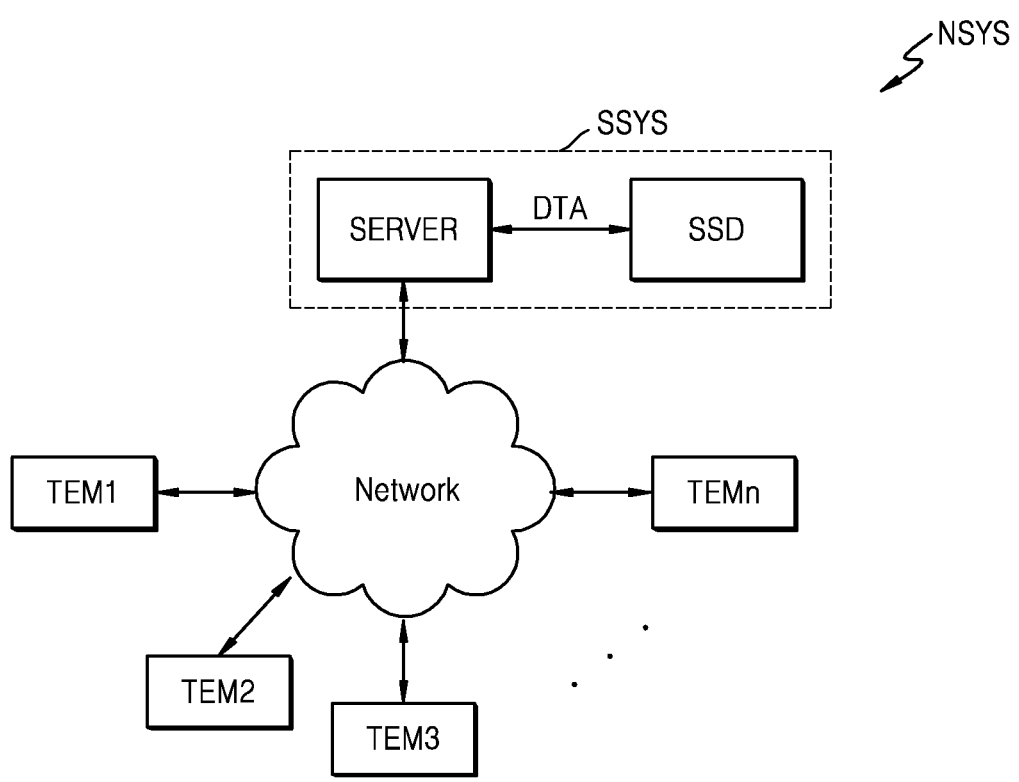
FIG. 15 is a block diagram of an embodiment of a network system according to the inventive concept.

FIG. 15 is a block diagram of a network system NSYS according to the inventive concept.

Referring to FIG. 15, the network system NSYS may include server system SSYS and a plurality of terminals TEM1~TEMn that are connected over a network. The server system SSYS may include a server SERVER that processes requests received from the terminals TEM1~TEMn connected to the network and an SSD that stores data corresponding to the requests received from the terminals TEM1~TEMn. In this regard, the SSD of FIG. 15 may be the same as the SSD described with reference to FIG. 14. That is, the SSD of FIG. 15 may be a semiconductor memory system that includes an SSD controller SCTL, and a flash memory MEM of a type described with reference to FIG. 5A.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A memory module set comprising:
a substrate;
a main integrated circuit (IC) mounted to the substrate;
a first memory module unit including at least one memory module mounted to the substrate, the at least one memory module comprising a first block of pins electrically connected to the main IC; and
a second memory module unit including at least one memory module mounted to the substrate, the at least one memory module of the second memory unit comprising a second block of pins electrically connected to the main IC, and,
wherein the first memory module unit, the second memory module unit and the main integrated circuit IC are spaced relative to one another on the substrate in one direction extending in a reference plane with the second memory module unit being disposed further from the main integrated IC than the first module unit in said one direction, and
the at least one memory module of second memory module unit is offset with respect to the at least one memory module of the first memory module unit by a first distance in a direction extending in the reference plane perpendicular to said one direction.

2. The memory module set of claim 1, further comprising:
a third memory module unit comprising a third block of pins electrically connected to the main IC, and at least one memory module mounted to the substrate,
the third memory module unit is spaced relative to each of the first memory module unit, the second memory module unit and the main integrated circuit IC in said one direction on the substrate with the third memory module unit being disposed closer to the main integrated IC than each of the first and second module units in said one direction, and
the at least one memory module of the first memory module unit is offset with respect to the at least one memory module of the third memory module unit by a second distance in a direction extending in the reference plane perpendicular to said one direction.

3. The memory module set of claim 2, wherein the first distance and the second distance are substantially the same, and
said direction in which the at least one memory module of the second memory module unit is offset with respect to the at least one memory module of the first memory module unit and said direction in which the at least one memory module of first memory module unit is offset with respect to the at least one memory module of the third memory module unit are the same.

4. The memory module set of claim 1, wherein the second memory module unit comprises a first memory module and a second memory module,
wherein the second block of pins comprises:
a first set of memory pins by which data stored in the first memory module can be accessed; and
a second set of memory pins by which data stored in the second memory module can be accessed,
wherein the memory pins of the first set are aligned with the memory pins of the second set, respectively, in said one direction.

5. The memory module set of claim 1, wherein the second memory module unit comprises a first memory module and a second memory module,
wherein the second block of pins comprises:
a first set of memory pins by which data stored in the first memory module can be accessed; and
a second set of memory pins by which data stored in the second memory module can be accessed,
wherein the first set of memory pins is offset with respect to the second set of memory pins in a direction perpendicular to said one direction, such that none of the memory pins of the first set are aligned with any of the memory pins of the second set in said one direction.

6. The memory module set of claim 1, wherein the second block of pins comprises a set of memory pins by which data stored in a said memory module of the second memory module unit can be accessed, and
the substrate has electrical wires extending between and electrically connecting the main IC and the memory pins, respectively, the electrical wires having substantially the same length.

7. The memory module set of claim 1, wherein the main IC constitutes at least one of a controller for controlling the at least one memory module of each of the first and second memory module units, a buffer for storing input and output data of the at least one memory module of each of the first and second memory module units, and an interface for controlling transmission and reception of data to and from an external device.

8. The memory module set of claim 1, wherein the at least one memory module of each of the first and second memory module units comprises a flash memory chip.

9. The memory module set of claim 1, wherein each said at least one memory module of each of the first and second memory module units is one of a single in-line memory module (SIMM), a dual in-line memory module (DIMM), and a Rambus in-line memory module (RIMM).

10. The memory module set of claim 1, wherein a said memory module of the first memory module unit or the second memory module unit comprises:
an error display unit for displaying an indication of an occurrence of an error in an operation of the memory module; and
a display control unit for controlling the error display unit.

11. A semiconductor memory system, comprising:
a substrate including electrical wiring;

at least one group of memory module units mounted to the substrate; and at least one main integrated circuit (IC) mounted to the substrate, wherein the memory module units of each said group are disposed on the substrate in a radial array about a respective said main IC, and each of the module units of the group comprises at least one memory module each having a plurality of memory pins connected to the respective main IC via the electrical wiring.

12. The semiconductor memory system of claim 11, wherein the electrical wiring comprises electrical wires respectively connected to the memory pins, and for each of the memory modules, the electrical wires that are connected to the memory pins thereof have substantially the same length.

13. The semiconductor memory system of claim 11, wherein the at least one group of memory module units comprises first and second groups of memory module units, the at least one main IC comprises first and second main ICs, the memory module units of said first group are disposed on the substrate in a first radial array about said first main IC, and the memory module units of said second group are disposed on the substrate in a second radial array about said second main IC, the first radial array has the pattern of a chevron pointing in a first direction and the second radial array has the pattern of a chevron pointing in a second direction opposite the first direction.

14. The semiconductor memory system of claim 13, wherein the first and second groups of memory module units are disposed directly adjacent to each other on the substrate in third and fourth directions perpendicular to the first and second directions, and such that the memory modules have a zig-zag pattern in the third and fourth directions.

15. The semiconductor memory system of claim 13, wherein the first and second groups of memory modules are disposed on opposite sides of the substrate in the first and second directions, and are offset with respect to each other in third and fourth directions perpendicular to the first and second directions.

16. An electronic device comprising:

a substrate including electrical wiring;

first and second memory module units; and a chip comprising a main integrated circuit (IC) mounted to the substrate, and wherein each of the memory module units includes at least one memory module mounted to the substrate, each said at least one memory module comprises a semiconductor memory device that stores data, and a plurality of memory pins electrically connected to the semiconductor memory device and electrically connected to the main IC via the electrical wiring, the size and shape of the footprints of the first and second memory module units are the same, the first memory module unit and the second memory module unit and the chip comprising the main IC are spaced relative to one another on the substrate along one direction extending in a reference plane with the second memory module unit being disposed further from the chip comprising the main IC than the first module unit in said one direction, and the second memory module unit is offset with respect to the first memory module unit in a direction extending in the reference plane perpendicular to said one direction.

17. The electronic device as claimed in claim 16, and further comprising a third memory module unit aligned in said direction perpendicular to said one direction with the chip comprising the main IC, the third module unit comprising a third semiconductor memory device that stores data, and plurality of memory pins electrically connected to the third semiconductor memory device and electrically connected to the main IC via the electrical wiring.

18. The electronic device as claimed in claim 17, and further comprising a fourth memory module unit and a fifth memory module unit, the fourth and fifth memory module units and the chip comprising the main IC are spaced on the substrate relative to one another along a direction opposite said one direction, each of the fourth and fifth memory module units also includes at least one memory module mounted to the substrate and comprising a semiconductor memory device that stores data, and plurality of memory pins electrically connected to the semiconductor memory device and electrically connected to the main IC via the electrical wiring, the size and shape of the footprints of the fourth and fifth memory module units are the same as those of the first and second memory module units, the first memory module unit is aligned with the fourth memory module unit in said one direction, and the fifth module unit is aligned with the second memory module unit in said one direction, and the memory modules of the first, second, third, fourth and fifth memory module units are arranged in the pattern of a chevron pointing in the direction perpendicular to said one direction.

19. The electronic device of claim 16, wherein the electrical wiring comprises discrete electrical wires electrically connecting the memory pins, respectively, to the main IC, and for each of the memory modules, the electrical wires that are connected to the memory pins thereof have substantially the same length.

20. The electronic device of claim 19, wherein each of the first and second memory module units includes first and second memory modules, the first memory module comprising a first semiconductor memory device that stores data, and a first set of memory pins disposed side-by-side in directions perpendicular to said one direction and electrically connected to the first semiconductor memory device and electrically connected to the main IC via the electrical wiring, and the second memory module comprising a second semiconductor memory device that stores data, and a second set of memory pins disposed side-by-side in directions perpendicular to said one direction and electrically connected to the second semiconductor memory device and electrically connected to the main IC via the electrical wiring, and wherein the first set of memory pins is offset with respect to the second set of memory pins in a direction perpendicular to said one direction, such that none of the memory pins of the first set are aligned with any of the memory pins of the second set in said one direction.

* * * * *